(12) United States Patent
Eu et al.

(10) Patent No.: US 7,985,672 B2
(45) Date of Patent: Jul. 26, 2011

(54) SOLDER BALL ATTACHMENT RING AND METHOD OF USE

(75) Inventors: Poh Leng Eu, Petaling Jaya (MY); Lan Chu Tan, Klang (MY); Cheng Qiang Cui, Singapore (SG)

(73) Assignee: Freescale Semiconductor, Inc., Austin, TX (US)

( * ) Notice: Subject to any disclaimer, the term of this patent is extended or adjusted under 35 U.S.C. 154(b) by 805 days.

(21) Appl. No.: 11/946,056

(22) Filed: Nov. 28, 2007

(65) Prior Publication Data
US 2009/0134207 A1 May 28, 2009

(51) Int. Cl.
*H01L 21/44* (2006.01)
(52) U.S. Cl. .......... 438/613; 257/E21.508; 29/879; 228/223
(58) Field of Classification Search .......... 438/613; 257/E21.508; 29/879; 228/207, 223
See application file for complete search history.

(56) References Cited

U.S. PATENT DOCUMENTS

| | | | |
|---|---|---|---|
| 5,591,941 A | 1/1997 | Acocella et al. | |
| 5,767,580 A * | 6/1998 | Rostoker | 257/737 |
| 5,931,371 A | 8/1999 | Pao et al. | |
| 5,959,355 A * | 9/1999 | Petit | 257/737 |
| 5,973,394 A * | 10/1999 | Slocum et al. | 257/690 |
| 6,465,747 B2 * | 10/2002 | DiStefano et al. | 174/261 |
| 6,578,755 B1 * | 6/2003 | Elenius et al. | 228/254 |
| 6,824,041 B2 | 11/2004 | Grieder et al. | |
| 7,115,997 B2 * | 10/2006 | Narayan et al. | 257/769 |
| 7,230,339 B2 * | 6/2007 | Key et al. | 257/773 |
| 7,241,640 B1 | 7/2007 | Zhang | |
| 7,473,580 B2 * | 1/2009 | Farooq et al. | 438/108 |
| 2002/0029902 A1 * | 3/2002 | DiStefano et al. | 174/260 |
| 2004/0188836 A1 * | 9/2004 | Key et al. | 257/738 |
| 2005/0017375 A1 * | 1/2005 | Ko et al. | 257/782 |
| 2005/0104217 A1 * | 5/2005 | Narayan et al. | 257/769 |
| 2008/0156852 A1 * | 7/2008 | Prakash | 228/256 |

FOREIGN PATENT DOCUMENTS

JP 10303330 A * 11/1998
JP 10303538 A * 11/1998

OTHER PUBLICATIONS

Alam et al., Effect of 0.5 wt% Cu addition in Sn-3.5% Ag solder on the dissolution rate of Cu metallization, Journal of Applied Physics, vol. 94, No. 12, 2003, pp. 7904-7909.*
Sean Moran; Vern Solberg; and Christopher P. Wade, Advanced Packaging—Micro-contact CSP, Jan. 2007, 5 pages, http://ap.pennnet.com/articles/article_display.cfm?article_id=283232.
Gerald Capwell, High-Density Design With MicroStar BGAs, Texas Instruments, Application Report SPRA471C, 13 pages.

* cited by examiner

*Primary Examiner* — David Vu
*Assistant Examiner* — Earl N Taylor
(74) *Attorney, Agent, or Firm* — Charles Bergere

(57) ABSTRACT

A method of attaching a solder ball to a bonding pad includes disposing flux on the bonding pad, attaching a conductive metal ring to the pad using the flux, and placing the solder ball in the ring. A reflow operation is performed that secures the ring to the pad and melts the solder ball into and around the ring. A solder joint is formed between solder ball and the pad, with the ring secured within the ball. Use of the ring allows for higher stand-off height to be achieved with similar solder ball size, without having to use bigger ball size as in the conventional method, which causes solder ball bridging. With higher stand-off height, better board level reliability performance can be obtained.

7 Claims, 1 Drawing Sheet

SOLDER BALL ATTACHMENT RING AND METHOD OF USE

BACKGROUND OF THE INVENTION

The present invention relates to the packaging of integrated circuits (ICs) and more particularly to a method of attaching a solder ball to a bonding pad and a ring therefore.

Many types of semiconductor packages use solder balls for package-to-package or package-to-board electrical connections. Many such packages use an array of solder balls, known as a Ball Grid Array (BGA). In order to achieve acceptable reliability, BGA packages must have a predetermined solder ball stand-off height. However, as package density and the number of I/Os increases, the size of the solder ball is constrained to achieve specified pad pitch. For example, increasing ball size may cause solder ball bridging problems during ball attach reflow. That is, solder balls may collapse, creating interconnects between adjacent balls.

FIG. 1 shows a conventional bonding pad 10 including flux 12 and a solder ball 14. The pad 10 typically has a pitch (distance from the center of the pad to the center of an adjacent pad) of about 0.65 mm. A normal size of the solder ball 14 is about 0.33 mm for a 0.65 mm pitch, and after reflow, the height of the ball 14 is reduced to about 0.27 mm, resulting in a low stand-off. However, if a larger ball is used, the aforementioned bridging problems may occur.

It would be advantageous to be able to increase solder ball stand-off height and at the same time, eliminate bridging problems.

BRIEF DESCRIPTION OF THE DRAWINGS

The following detailed description of preferred embodiments of the invention will be better understood when read in conjunction with the appended drawings. The present invention is illustrated by way of example and is not limited by the accompanying figures, in which like references indicate similar elements. It is to be understood that the drawings are not to scale and have been simplified for ease of understanding the invention.

DETAILED DESCRIPTION OF THE INVENTION

Figure 3:
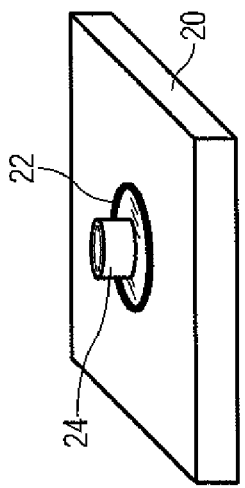
FIGS. 2-3 and 5-6 illustrate a method of attaching a solder ball to an integrated circuit bonding pad in accordance with an embodiment of the invention.

The detailed description set forth below in connection with the appended drawings is intended as a description of a presently preferred embodiment of the invention, and is not intended to represent the only form in which the present invention may be practiced. It is to be understood that the same or equivalent functions may be accomplished by different embodiments that are intended to be encompassed within the spirit and scope of the invention. In the drawings, like numerals are used to indicate like elements throughout.

In one embodiment, the present invention provides a method of attaching a solder ball to a bonding pad, including the steps of attaching a ring to a top surface of the bonding pad; and placing the solder ball on top of said ring such that the solder ball is set within said ring.

In another embodiment, the present invention provides a stand-off ring for attaching a solder ball to a bonding pad. The stand-off ring comprises a generally cylindrical body having an outer wall and an opening formed in a top surface of the body, wherein the opening leads to a cavity in the body and the opening and the cavity are sized to receive a solder ball.

A method of attaching a solder ball to an integrated circuit pad will now be described with reference to FIGS. 2-5.

Figure 2:
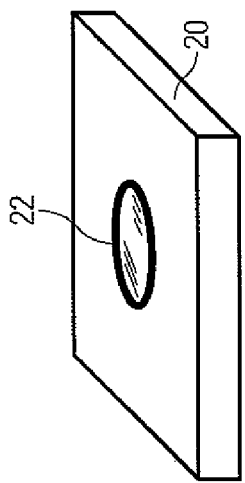

FIG. 2 shows a bonding pad 20 of a semiconductor integrated circuit. In one embodiment, the bonding pad 20 has a pitch of about 0.65 mm. The dimensions used below conform to a bonding pad pitch of 0.65 mm. However, it will be understood by those of skill in the art that if the pitch is changed, then the other dimensions used below will similarly change. In a first step, a predetermined amount of flux 22 is dispensed onto the bonding pad 20. Preferably, the flux 22 is dispensed over substantially the entire surface of the bonding pad 20. However, the flux 22 could be disposed around the center of the bonding pad 20. The flux 22 may be disposed onto the surface of the bonding pad 20 in a known manner, such as with a pin transfer method or screen printing method.

Figure 4:
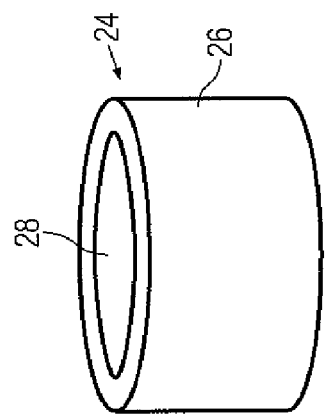
FIG. 4 is a greatly enlarged isometric view of a stand-off ring in accordance with an embodiment of the present invention.

FIG. 3 shows a stand-off ring 24 disposed on the flux 22 on the bonding pad 20. The stand-off ring 24 may be disposed onto the surface of the bonding pad 20 using a ball placement tool, which is the same tool as used for placing solder balls on bonding pads. FIG. 4 is a greatly enlarged isometric view of the stand-off ring 24. The stand-off ring 24 preferably is formed of an electrically conductive metal, such as aluminum or copper and should be plated. For a copper ring, the presently preferred plating material is Ni followed by Au. The stand-off ring 24 has a generally cylindrical body having an outer wall 26 and an opening 28 formed in a top surface of the body. The opening 28 leads to a cavity in the body. The opening 28 and the cavity are sized to receive a solder ball (described below). In one embodiment of the invention, the ring 24 has a height of about 0.15 mm to about 0.25 mm and an outer diameter of about 0.28 mm. An inner diameter or the diameter of the opening 28 may be about 0.22 mm, although it will be understood by those of skill in the art that the invention is not restricted to these dimensions. Additionally, although the ring 24 is shown as being cylindrical in shape, the ring could be embodied with other shapes, such as rectangular. In one embodiment of the invention, the cavity comprises a through-hole.

Figure 5:
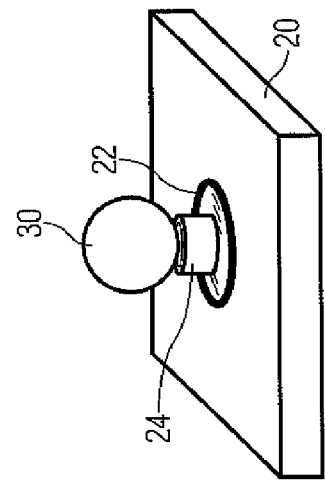
Figure 1:
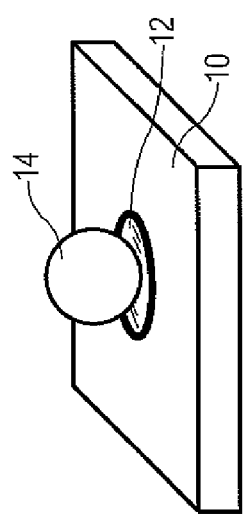
FIG. 1 is an enlarged isometric view of a conventional integrated circuit bonding pad with a solder ball attached thereto.

Referring now to FIG. 5, a solder ball 30 is placed onto the top of the ring 24 such that the ball 30 rests in the opening 28 of the ring 24. The solder ball 30 may be placed on the ring 24 using a ball placement tool. In one embodiment, the solder ball 30 has a diameter of about 0.33 mm for a pad pitch of 0.65 mm. It is noted that in the prior art it is common to use a 0.33 mm diameter solder ball when the pad pitch is 0.65 mm.

Figure 6:
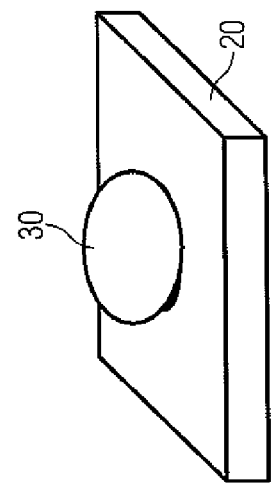

FIG. 6 shows the solder ball 30 after a reflow operation has been performed. The solder ball 30 is melted such that the solder flowed into and around the ring 24, but does not flow to or over the edges of the pad 20, which could lead to bridging. For example, when a 0.6 mm ball is used, after reflow, the ball collapse to about 0.5 mm; In contrast, the prior art uses a 0.5 mm ball that collapse to about 0.4 mm. In the prior art, use of a larger ball could cause bridging. In another example, if a 0.75 mm ball is used, after reflow the ball collapses, but use of the ring allows for a stand-off height of greater than about 0.6 mm.

As is evident from the foregoing discussion, the present invention provides a stand-off ring and a method of attaching a solder ball to a bonding pad using the stand-off ring. Improvement on C5 solder ball stand-off height is achieved by adding a copper ring at the ball attach process. That is, after flux placement, the copper ring is placed on each solder pad using the same ball pickup tool as used for the solder balls, followed by solder ball attachment on top of the copper rings. After reflow, the copper rings on the solder pads provide for an increased solder ball stand-off height. Such an increased stand-off height helps to improve board level performance of BGA packages.

The description of the preferred embodiments of the present invention have been presented for purposes of illustration and description, but are not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiments disclosed, but covers modifications within the spirit and scope of the present invention as defined by the appended claims.

The invention claimed is:

1. A method of increasing a stand-off height of a solder ball attached to a bonding pad, comprising:

disposing a predetermined amount of flux on the bonding pad;

after disposing said flux on the bonding pad, attaching a ring on a top surface of the bonding pad using said flux, wherein said ring is placed on the top surface of the bonding pad using a ball placement tool; and placing the solder ball on top of said ring such that the solder ball is set within said ring, wherein said ring increases the stand-off height of the solder ball.

2. The method of claim 1, wherein said ring has a height of about 0.2 mm and a diameter of about 0.28 mm and the solder ball has a diameter of about 0.33 mm.

3. The method of claim 2, further comprising performing a reflow operation on the solder ball and ring, wherein the solder ball melts into and around said ring.

4. The method of claim 3, wherein the solder ball has a height of about 0.27 mm after the reflow operation.

5. The method of claim 2, wherein said ring is formed of copper.

6. The method of claim 5, wherein said ring is plated with a Ni/Au finish.

7. The method of claim 1, wherein the solder ball is placed on said ring using the ball placement tool.

* * * * *